(12) United States Patent
Imai

(10) Patent No.: US 6,297,529 B1
(45) Date of Patent: Oct. 2, 2001

(54) SEMICONDUCTOR DEVICE WITH MULTILAYERED GATE STRUCTURE

(75) Inventor: Kiyotaka Imai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/286,334

(22) Filed: Apr. 5, 1999

(30) Foreign Application Priority Data

Apr. 20, 1998 (JP) .................................................. 10-109208

(51) Int. Cl.⁷ ..................................................... H01L 21/82
(52) U.S. Cl. ........................ 257/318; 257/350; 257/288; 257/315; 257/316; 257/318; 257/319; 257/380
(58) Field of Search .................................... 257/350, 288, 257/315, 316, 318, 319, 368, 380

(56) References Cited

U.S. PATENT DOCUMENTS

| | | | |
|---|---|---|---|
| 5,441,904 | * 8/1995 | Kim et al. | ............................... 437/40 |
| 5,652,156 | 7/1997 | Liao et al. . | |
| 5,841,170 | * 11/1998 | Adan et al. | .............................. 257/69 |
| 6,020,260 | * 2/2000 | Gardner | .................................. 257/762 |

FOREIGN PATENT DOCUMENTS

| | | |
|---|---|---|
| 364 818 | 4/1990 | (EP) . |
| 466 166 | 1/1992 | (EP) . |
| 497 596 | 8/1992 | (EP) . |
| 0 860 863 A2 | 8/1998 | (EP) . |
| 0 860 863 A3 | 10/1998 | (EP) . |
| 2 254 960 | 10/1992 | (GB) . |
| 2 300 298 | 10/1996 | (GB) . |
| 2 318 451 | 4/1998 | (GB) . |
| 63-255964 | 10/1988 | (JP) . |
| 1-173713 | 7/1989 | (JP) . |
| 2-298074 | 12/1990 | (JP) . |
| 10-93077 | 4/1998 | (JP) . |

* cited by examiner

Primary Examiner—Fetsum Abraham

(57) ABSTRACT

A semiconductor device is provided which is capable of suppressing an increase in the layer resistance of the gate electrode and preventing an increase of the contact resistance of the gate electrode with the silicide layer.

The above properties of the semiconductor device are provided by forming the gate electrode comprising multiple layers, and the lowermost layer of the gate electrode is doped with an impurity, and other upper layers are formed undoped.

4 Claims, 3 Drawing Sheets

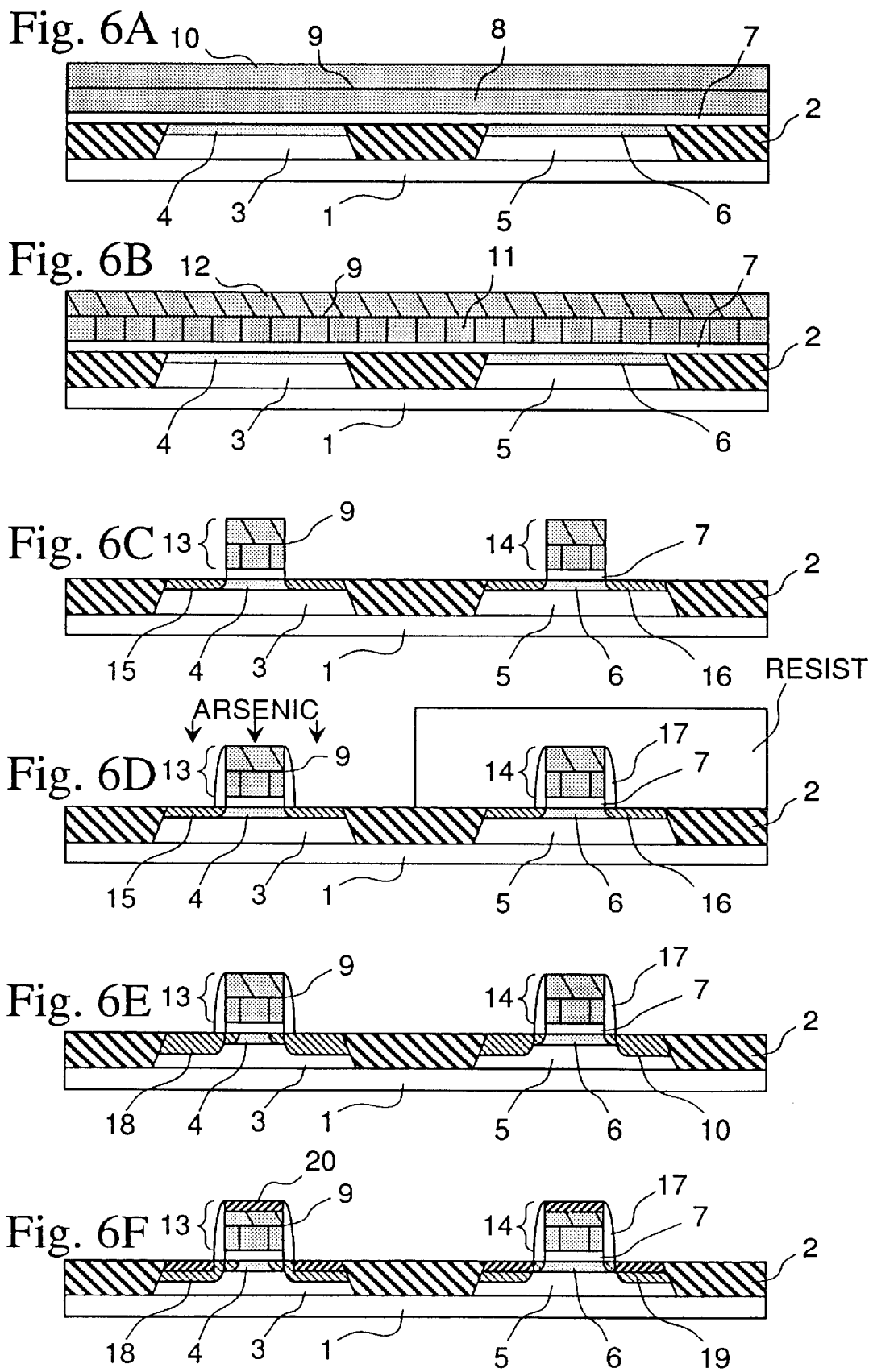

SEMICONDUCTOR DEVICE WITH MULTILAYERED GATE STRUCTURE

BACKGROUND OF THE INVENTION

1. Field of the Invention

The present invention relates to a semiconductor device having a gate electrode formed by a multi-layered structure and a method of making the same.

The present Application is based on Patent Application No. Hei 10-109208 filed in Japan, the content of which is incorporated herein by reference.

2. Background Art

Recently, dual gate electrodes have been used for MOS transistors, that is, $N^+$ gates have been used for NMOS transistors and $P^+$ gates have been used for PMOS transistors.

In the case of using the dual gate structure, the following problems are encountered. One problem is that impurities can pass through the gate.

Practically, it is known that boron used as a dopant for the source/drain and the gate electrode passes from the gate electrode to the gate oxide layer and reaches the threshold control region (channel region) as a result of thermal treatment at high temperatures, which results in causing the fluctuations of the threshold value.

This phenomenon is particularly remarkable when the boron is doped using boron fluoride (BF2) by ion implantation.

Another problem is that the gate electrode is subjected to depletion. Actually, arsenic used for doping in the source/drain and the gate electrode is less thermally diffusible in comparison with boron. Thus, if the sufficient thermal treatment is not conducted after ion implantation of arsenic, the concentration of arsenic at the bottom surface of the NMOS-type gate electrode (near the interface with a gate oxide film) becomes low, causing depletion and reduction of the drain current.

The above mentioned two problems are opposite from the technical point of view and cannot be solved only by optimization of the heat treatment.

Moreover, it becomes an important object to improve the reliability of the gate oxide film, because the gate oxide film has become thinner with advances in the microstructure of transistors.

Recently, M. Koba et al. reported in "Improving Gate Oxide Integrity in p+ PMOSFET by Using Large Grain Size Polysilicon Gate" IEDM Tech. Dig., p. 471, 1993, that the initial withstanding voltage can be improved when the gate electrode is formed using large grain polycrystalline silicone.

However, H. Ito et al. reported in "Gate Electrode Microstructure Having Stacked Large-Grain Poly Si with Ultra-Thin SiOx Interlayer for Reliability in Sub-micrometer CMOS" IEDM Tech. Dig., p. 635, 1997, that, when a large grain polycrystalline silicon is used, the arsenic ion is likely to cause channeling at the time of ion implantation of the arsenic for doping in the source/drain of NMOS and the gate electrode.

Consequently, it was discovered that the arsenic ion, which must remain in the gate electrode, reaches the surface of the silicon substrate and causes anomalies in the electric characteristics of the transistor.

In order to solve the above problem, H. Ito proposes a gate structure which is formed by double layers of the large grain polycrystalline silicon.

This gate structure is formed by inserting an electrically non-conductive oxide layer between two polycrystalline silicon layers such that the face orientation of the upper layer made of large grain polycrystalline silicon is not affected by the face orientation of the lower layer of large grain polycrystalline silicon.

The above structure including the oxide layer reduces the probability of channeling by the arsenic ion, because the face orientations of the upper and lower large grain polycrystalline silicon layers slip to each other.

Furthermore, by addition of an N-type phosphorous impurity at the concentration of $3 \times 10^{19}$ cm$^{-3}$ to those large grain polycrystalline silicon layers, a successful result is obtained in preventing depletion of the NMOS electrode, if the thermal treatment is performed within a temperature range in which the boron in the NMOS electrode does not pass through. As a result of this structure, two problems in the case of the dual gate structure can be settled.

A method is described below for manufacturing the dual gate CMOS proposed by H. Ito et al., which uses two layers of phosphorous doped large grain polycrystalline silicon by placing one upon another.

As shown in FIG. 6A, element separating regions 2 are formed on a silicon substrate 1, a P well 3 and an NMOS channel region 4 are formed in the NMOS forming region, and an N well 5 and a PMOS channel region 6 are formed in the PMOS forming region.

After growing the gate oxide film 7, a first phosphorous doped amorphous silicon layer 8 is grown, and on that layer, an oxide layer 9 having a thickness of 1 μm is continuously grown by the use of a mixed gas of oxygen and nitrogen, and a second phosphorous doped amorphous silicon layer 10 is formed on the oxide layer 9. Here, the first and second phosphorous doped amorphous silicone layers 8 and 10 contain phosphorous at a concentration of $3 \times 10^{19}$ cm$^{-3}$.

Subsequently, as shown in FIG. 6B, a heat treatment is conducted (at 900° C. for 10 seconds) for crystallization of the first and the second phosphorous doped amorphous silicon layers 8 and 10, and a first phosphorous-doped large grain polysilicon layer 11 and a second phosphorous doped large grain polysilicon layer 12 are formed.

Subsequently, as shown in FIG. 6C, the NMOS gate electrode 13 and the PMOS gate electrode 14 are formed by patterning the first and second phosphorous-doped large grain polysilicon layers 11 and 12.

Next, an N-type LDD region 15 is formed by implanting phosphorous or arsenic in the NMOS Channel region 4 and a P-type LDD region 16 is formed by implanting boron or $BF_2$ in the PMOS Channel region 6.

As shown in FIG. 6D, after forming the side wall spacer 17, arsenic is implanted in the NMOS region to dope source/drain region 18 and the NMOS gate electrode into $N^+$.

Similarly, boron or $BF_2$ is implanted in the PMOS region to dope the source/drain region and PMOS gate electrode with $P^+$. At this time, the PMOS gate electrode 14 becomes $P^+$ by compensation of N-type dopants.

Next, as shown in FIG. 6E, the device is heat treated (at 1020° C. for 40 seconds) for activation.

As shown in FIG. 6F, silicide layers 20 are formed on the surfaces of the $N^+$ type source/drain region and NMOS gate electrode, and on the surfaces of the $P^+$ type source/drain region and the PMOS gate electrode in order to reduce the layer resistance.

The method of manufacturing the semiconductor device shown in FIG. 6 uses a gate electrode structure which is formed by double layers of phosphorous doped large grain polysilicon and the phosphorous at a concentration of $3 \times 10^{19}$ cm$^{-3}$ is contained as an impurity in the P$^+$ type PMOS electrode 14.

This impurity is introduced for preventing the depletion of the NMOS electrode 13, and the impurity of phosphorous in the PMOS electrode 14 is not substantially necessary. The N-type impurity of phosphorous is compensated by a P-type impurity of boron in the source/drain region 19 and the gate electrode 14 of the PMOS.

However, there is a problem that the layer resistance of the PMOS gate rises due to the presence of the phosphorous.

When the silicide layer is formed on the gate electrode surface, another problem arises that the contact resistance between the silicide layer and the large grain polysilicon forming the P$^+$ type gate electrode 14 rises.

Furthermore, since the upper and lower layers of large grain polysilicon have the same grain size, and if the upper layer and the lower layer are formed such that both layers have the same face orientation by chance, a problem arises that channeling of arsenic is caused.

It is therefore an object of the present invention to provide a semiconductor device and a method of producing the same in which the above problems are solved.

SUMMARY OF THE INVENTION

In order to solve the above problems, the first aspect of the present invention relates to a semiconductor device having a gate electrode formed in a multiple layered structure, wherein the lowermost layer of the gate electrode is doped with an impurity.

The second aspect of the present invention relates to a semiconductor device according to the first aspect, wherein said impurity is phosphorous as an N-type impurity.

The third aspect of the present invention relates to a semiconductor device according to the first aspect of the present invention, wherein said gate electrode comprises multiple polycrystalline silicon layers and oxide layers which are not electrically conductive and which are inserted between said polycrystalline silicon layers.

The fourth aspect of the present invention relates to a semiconductor device according to the first aspect, wherein said gate electrode comprises polycrystalline silicon layers and the crystal grain size of the upper layers is smaller than the crystal grain size of the lowermost polycrystalline silicon layer.

The fifth aspect of the present invention relates to a method of producing a semiconductor device having a multiple layered gate electrode; wherein said method comprises the steps of:

growing an amorphous silicon layer containing a phosphorous dopant;

growing an oxide layer on said layer;

growing a non-doped amorphous silicon on said oxide layer; and annealing for crystallization.

BRIEF DESCRIPTION OF THE DRAWINGS

FIGS. 6A, 6B, 6C, 6D, 6E, and 6F are cross sectional views showing a method of manufacturing a conventional semiconductor device in the order of manufacturing process.

DETAILED DESCRIPTION OF THE PREFERRED EMBODIMENTS

Preferred embodiments of the present invention will be described with reference to the attached drawings.

[First Embodiment]

Figure 1:
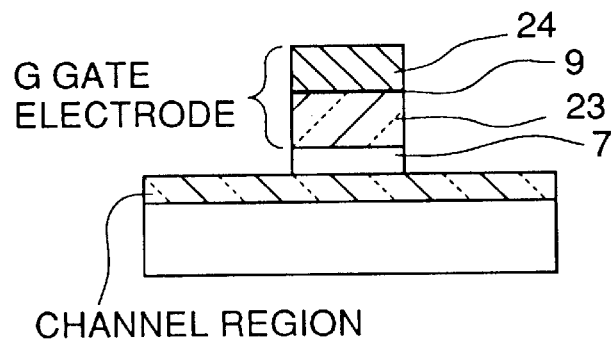
FIG. 1 shows a cross sectional view of a semiconductor device according to an embodiment of the present invention.

FIG. 1 shows a cross sectional view of a semiconductor device according to an embodiment of the present invention.

In FIG. 1, the semiconductor device according to an embodiment of the present invention comprises a gate electrode G formed by a multiple layered structure, wherein an impurity is only contained in the lowermost layer of the gate electrode G. The impurity is phosphorous as the N-type impurity.

The gate electrode G is composed of multiple layers of polycrystalline silicon layers 23 and 24, and a non-conductive oxide layer 9 is inserted between polycrystalline silicon 23 and 24.

The grain size of the upper polycrystalline silicon layer 24 is smaller than that of the lower polycrystalline silicon layer 23.

Figure 5:
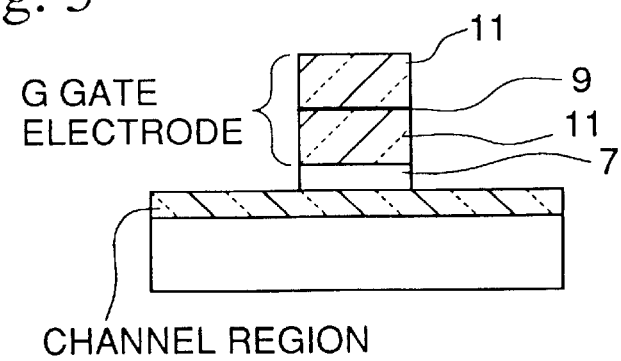
FIG. 5 is a diagram showing a conventional semiconductor device.

As shown in FIG. 5, in a conventional gate electrode formed by multi-layered large grain polysilicon, all of the stacked polysilicon multiple layers 11, 11 are doped with phosphorous. However, in the gate electrode according to first embodiment of the present invention shown in FIG. 1, only the lowermost large grain size polysilicon layer 23 is doped with phosphorous.

Consequently, according to the first embodiment of the present invention, since the upper polysilicon layer is not doped with phosphorous, the polycrystalline silicon layer is capable of, while playing a role to suppressing the depletion of the NMOS gate electrode, restricting the increase of the layer resistance of the PMOS gate electrode and preventing an increase of the contact resistance between the silicide layer formed on the PMOS gate electrode and the pMOS gate electrode.

According to the first embodiment of the present invention, the large grain size silicon layer 23 is formed by crystallization of the annealed amorphous silicon layer.

It is known that the crystal grain size becomes large in the annealing and crystallizing processes, if the amorphous silicon layer includes an impurity.

In the conventional example shown in FIG. 5, since all of the layers 11, 11 are doped with phosphorous, the grain sizes of the large grain polycrystalline silicon layers 11, 11 are the same.

In contrast, in the first embodiment of the present invention shown in FIG. 1, only the lowermost layer 23 is doped with phosphorous to be converted into a large grain polycrystalline silicon layer, and the upper layer not containing the dopant of phosphorous is formed with smaller grain size than that of the lowermost layer 23.

The polycrystalline silicon layer with a comparatively smaller crystal size is effective in preventing channeling.

Therefore, the first embodiment of the present invention, while maintaining the initial withstanding voltage of the gate oxide film 7, is more capable of suppressing the channeling of arsenic than the conventional method.

Hereinafter, the method of manufacturing the semiconductor device according to the first embodiment of the present invention is described in the order of processing.

Figure 2A:
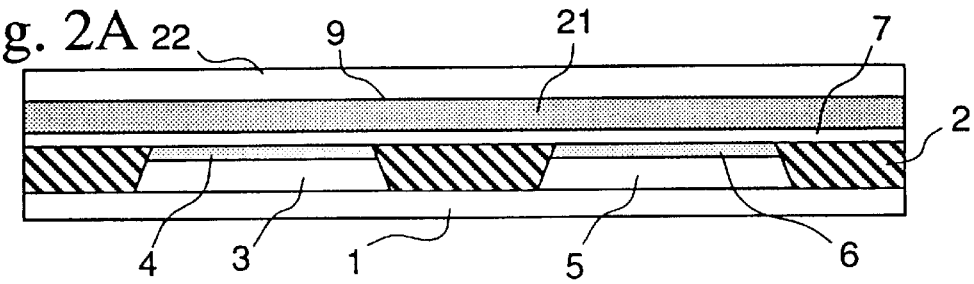
FIGS. 2A, 2B, 2C, 2D, 2E, and 2F are cross sectional views showing a method of manufacturing a semiconductor device of the present invention in the order of manufacturing processes.

As shown in FIG. 2A, an element separating region 2 is formed on the silicon substrate 1, a P well 3 and a NMOS channel region 4 are formed in the NMOS forming region, and N well 5 and a PMOS channel region 6 are formed in the PMOS forming region.

After growing a gate oxide layer 7, a phosphorous doped amorphous silicon layer 21 containing phosphorous at a concentration of $3 \times 10^{19}$ cm$^{-3}$ is grown, an oxide layer 9 is grown continuously on the amorphous silicon layer by a mixture of oxygen and nitrogen, and a non-doped amorphous silicon layer 22 is further grown thereon.

Figure 2B:
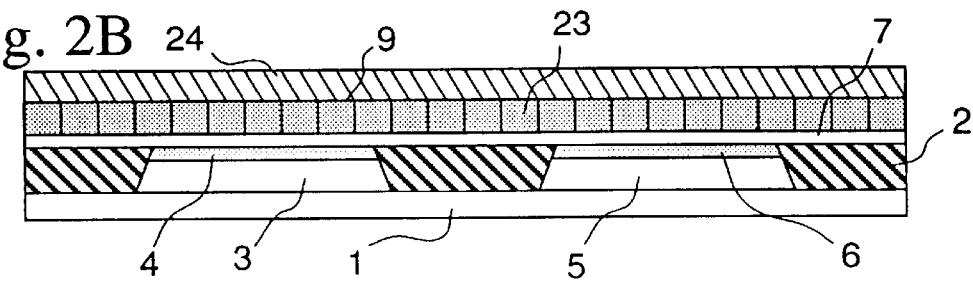

As shown in FIG. 2B, a heat treatment (at 900° C. for 10 seconds) is executed for crystallization of the phosphorous doped amorphous silicone layer 21 and the non-doped amorphous silicone layer 22 to form a phosphorous doped large grain polycrystalline silicon layer 23 and a non-doped polycrystalline silicon layer 24. Since the non-doped polycrystalline silicon layer 24 does not includes phosphorous, the crystal grain size of this non-doped polycrystalline silicon layer is smaller than that of the phosphorous doped polycrystalline silicon layer 23.

Figure 2C:
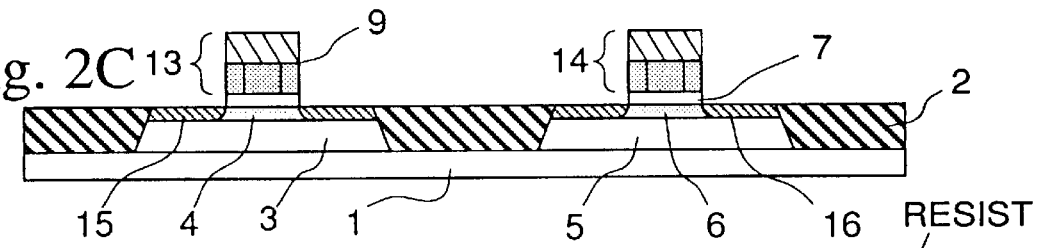

Next, as shown in FIG. 2C, the NMOS gate electrode 13 and the PMOS gate electrode 14 are formed by patterning the phosphorous doped large grain polycrystalline silicon 23 and the non-doped polycrystalline silicone layer 24.

Thereafter, an N-type LDD 15 is formed by implanting phosphorous or arsenic in the NMOS region, and a P-type LDD 16 is formed by implanting boron or BF$_2$.

Figure 2D:
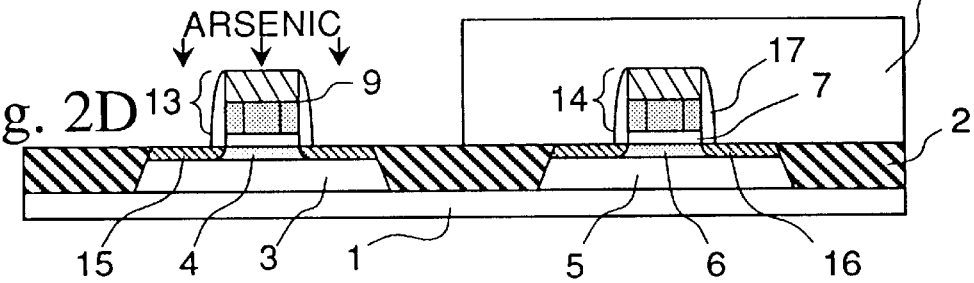

Next, as shown in FIG. 2D, implanting arsenic in the NMOS region is carried out after forming the side wall spacer 17 for doping the source/drain region 18 and the NMOS gate electrode 13 into N$^+$. Similarly, implanting boron or BF$_2$ in the PMOS region is carried out for doping the source/drain region 19 and the PMOS gate electrode 14 into P$^+$.

Figure 2E:
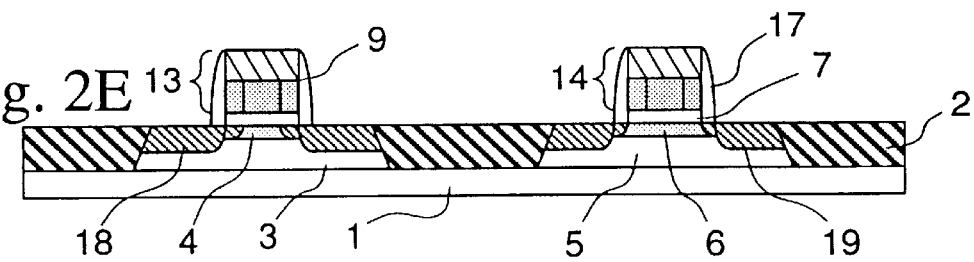

Next, as shown in FIG. 2E, the heat treatment for activation (at 1020° C. for 40 seconds) is executed.

Figure 2F:
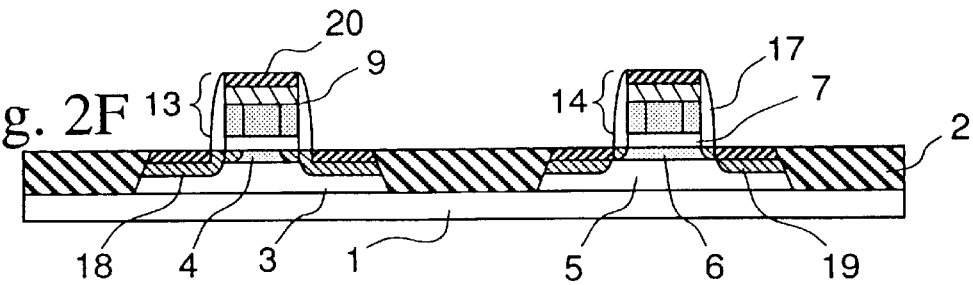

Next, as shown in FIG. 2F, silicide layers 20 are formed on the surfaces of the N$^+$ type source/drain region 18, NMOS gate 13, P+ type source/drain region 19, and PMOS gate 14.

As shown in FIGS. 1 and 2, according to the first embodiment of the present invention, in the gate electrode which is formed of two or more than two layers of polycrystalline layers, the lowermost layer of the gate electrode is doped with an N-type impurity of phosphorous and is comprised of a large grain polycrystalline silicon layer 23, and the upper layer 24 on the lowermost silicon layer does not contain an impurity of phosphorous.

Therefore, while the lowermost layer 23, which includes phosphorous and which is formed of a large grain polycrystalline silicone layer, plays a role to suppress the depletion of nMOD similar to the conventional role, the upper layer, which does not include phosphorous, is capable of preventing an increase of the layer resistance of the PMOS gate electrode 14 and preventing contact resistance with the silicide layer 20.

In addition, the grain size of the upper polycrystalline silicon layer 24 is smaller than that of the lowermost large grain polycrystalline silicon layer 23. The large grain sized polycrystalline silicon layer is produced by annealing and crystallizing the amorphous silicon layer. It is known that, if the amorphous silicon layer includes an impurity, the crystal grain size becomes larger.

In the conventional example shown in FIG. 5, all of the layers forming the gate electrode are doped with phosphorous, so that the grain size of every large grain polycrystalline silicon layer 11, 11 is the same.

In contrast, in the first embodiment of the present invention shown in FIGS. 1 and 2, the lowermost layer 23 containing phosphorous only is composed of larger grains, and upper layer 24 which does not contain the phosphorous dopant is formed of small grain polycrystalline silicon.

The polycrystalline silicon layer composed of small grains is effective in suppressing channeling by the arsenic dopant. Therefore, the first embodiment of the present invention, while preserving the initial withstanding voltage of the gate oxide layer as usual, is effective in suppressing the arsenic channeling.

Figure 3:
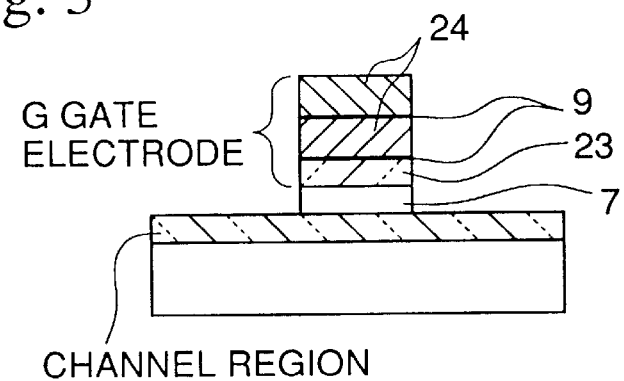
FIG. 3 is a diagram showing a modified example of a semiconductor device according to the first embodiment of the present invention.

In the first embodiment of the present invention shown in FIG. 1, an example is described which has one layer of the non-doped polycrystalline silicon. However, it is possible to produce a semiconductor device with two or more than two layers of the non-doped polycrystalline layers 24 as shown in FIG. 3, which is more preferable because of it is more capable of effectively preventing the channeling.

[Second Embodiment]

Figure 4:
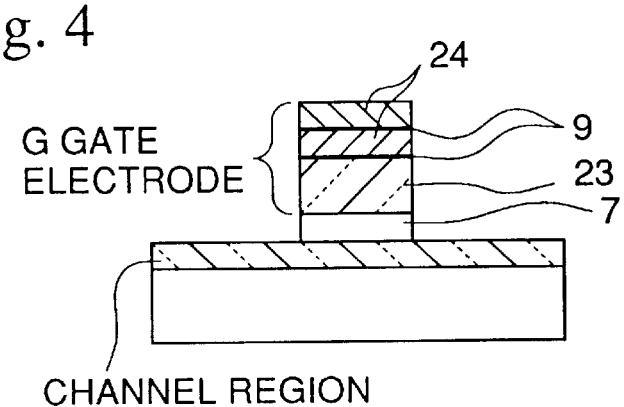
FIG. 4 is a diagram showing a modified example of a semiconductor device according to the second embodiment of the present invention.

FIG. 4 shows a cross sectional view of the second embodiment of the present invention.

The second embodiment of the present invention is, as shown in FIG. 4, used for a semiconductor device having a gate electrode G composed of three or more than three layers of polycrystalline silicon layers. The lowermost layer is formed by a large grain polycrystalline silicon layer 23 containing an n-type impurity of phosphorous, wherein upper polycrystalline silicone layers 24 do not contain the phosphorous dopant, and the grain size of the upper polycrystalline silicon layers 24 is smaller than that of the lowermost large size polysilicon layer.

In the second embodiment of the present invention shown in FIG. 4, the grain size of the upper polycrystalline layers is made far smaller than the grain size of the lowermost polycrystalline layer by decreasing the height of the crystal grains in the upper layers than the height of the crystal grains of the lowermost layer. This is practically realized by reducing the intervals of inserting the oxide film between polycrystalline silicon layers 24, as opposed to disposing the oxide films 9 at the same interval.

As hereinabove described, the gate electrode of the present invention is formed by a multiple layered structure, in which only the lowermost layer is doped with an impurity as a dopant, and upper layers are formed as non-doped layers. Therefore, the gate electrode of the present invention suppresses the depletion of the gate electrode as usual, suppresses the layer resistance of the gate electrode, and prevents the resistance of the silicide layer formed on the gate electrode surface from increasing.

Furthermore, since the lowermost layer only is crystallized into larger crystal grains, and the upper layers are crystallized into smaller crystal grains, and because the upper layers do not include an impurity, the gate electrode of the present invention is capable of reducing the channeling to a smaller level than usual, while improving the initial withstanding voltage of the oxide layer.

What is claimed is:

1. A semiconductor device having a gate electrode formed in a multiple layered structure, wherein the lowermost layer of the gate electrode is doped with an impurity, and one of the two uppermost layers of the gate electrode is an undoped polycrystalline silicon layer.

2. A semiconductor device according to claim 1, wherein said impurity is phosphorous as an N-type impurity.

3. A semiconductor device according to claim 1, wherein said gate electrode comprises multiple polycrystalline silicon layers and oxide layers which are not electrically conductive and which are present between said polysilicon layers.

4. A semiconductor device according to claim 1, wherein said gate electrode comprises polycrystalline silicon layers and the crystal grain size of the upper layers is smaller than the crystal grain size of the lowermost polycrystalline silicon layer.

* * * * *